United States Patent
Prall et al.

(10) Patent No.: US 6,514,842 B1
(45) Date of Patent: Feb. 4, 2003

(54) LOW RESISTANCE GATE FLASH MEMORY

(75) Inventors: Kirk D. Prall, Boise, ID (US); Pai-Hung Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/924,740

(22) Filed: Aug. 8, 2001

Related U.S. Application Data

(62) Division of application No. 09/350,687, filed on Jul. 9, 1999, now Pat. No. 6,288,419.

(51) Int. Cl.[7] .................................. H01L 21/3205
(52) U.S. Cl. .................. 438/593; 438/595; 438/587
(58) Field of Search ................. 257/315; 438/593, 438/595, 587

(56) References Cited

U.S. PATENT DOCUMENTS

| | | | |
|---|---|---|---|
| 4,527,259 A | 7/1985 | Watanabe | 365/189 |
| 5,194,925 A | 3/1993 | Ajika et al. | 257/314 |
| 5,268,319 A | 12/1993 | Harari | 437/43 |
| 5,304,503 A | 4/1994 | Yoon et al. | 437/43 |
| 5,545,578 A | 8/1996 | Park et al. | 437/44 |
| 5,568,418 A | 10/1996 | Crisenza et al. | 365/185.01 |
| 5,650,648 A | 7/1997 | Kapoor | 257/316 |
| 5,707,898 A | 1/1998 | Keller et al. | 438/265 |
| 5,708,285 A | 1/1998 | Otani et al. | 257/315 |
| 5,734,607 A | 3/1998 | Sung et al. | 365/185.01 |
| 5,736,455 A | 4/1998 | Iyer et al. | 138/592 |
| 5,739,066 A | 4/1998 | Pan | 438/595 |
| 5,776,787 A | 7/1998 | Keshtbod | 437/43 |
| 5,838,041 A | 11/1998 | Sakagami et al. | 257/324 |
| 5,925,918 A * | 7/1999 | Wu et al. | |
| 5,929,492 A | 7/1999 | Okamura | 257/365 |
| 5,936,274 A | 8/1999 | Forbes et al. | 257/315 |
| 5,962,904 A | 10/1999 | Hu | 257/412 |
| 5,977,601 A | 11/1999 | Yang et al. | 257/437 |
| 6,060,741 A | 5/2000 | Huang | 257/315 |
| RE36,938 E | 10/2000 | Chan et al. | 438/612 |
| 6,258,665 B1 * | 7/2001 | Shimizu et al. | |
| 6,429,108 B1 * | 8/2002 | Chang et al. | |
| 6,432,787 B1 * | 8/2002 | Mandelman et al. | |

FOREIGN PATENT DOCUMENTS

EP 0308316 A1 * 3/1989

* cited by examiner

*Primary Examiner*—Stephen D. Meier
(74) *Attorney, Agent, or Firm*—Schwegman, Lundberg, Woessner & Kluth, P.A.

(57) ABSTRACT

Floating gate stacks having a metal control gate and a polysilicon floating gate and their methods of fabrication that are particularly useful for floating gate memory cells and apparatus produced therefrom. The metal control gate permits reduced gate resistance and gate height over polysilicon or silicide control gates. An oxidation barrier is formed on sidewalls of the metal control gate to protect it from oxidation during oxidation of sidewalls of the polysilicon floating gate. The oxidation barrier is useful in reducing peeling, stress and related oxidation problems when using metals such as tungsten in the metal control gate.

26 Claims, 8 Drawing Sheets

(BACKGROUND)

(BACKGROUND)

(BACKROUND)

LOW RESISTANCE GATE FLASH MEMORY

This application is a division of U.S. patent application No. 09/350,687, filed on Jul. 9, 1999 now U.S. Pat. No. 6,288,419, the specification of which is incorporated herein by reference.

TECHNICAL FIELD

The present invention relates generally to floating gate stacks commonly found in floating gate memory cells, and in particularly to floating gate stacks having a metal control gate protected from oxidation during oxidation of the floating gate, methods of their fabrication and apparatus produced therefrom.

BACKGROUND

A flash memory device is a non-volatile memory, derived from erasable programmable read-only memory (EPROM) and electrically-erasable programmable read-only memory (EEPROM). Flash memory is being increasingly used to store execution codes and data in portable electronic products, such as computer systems.

A typical flash memory comprises a memory array having a large number of memory cells arranged in blocks. Each of the memory cells is fabricated as a field-effect transistor having a control gate and a floating gate. The floating gate is capable of holding a charge, and is separated, by a layer of thin oxide, from source and drain regions contained in a substrate. Each of the memory cells can be electrically programmed (charged) by injecting electrons from the drain region through the oxide layer onto the floating gate. The charge can be removed from the floating gate by tunneling the electrons to the source through the oxide layer during an erase operation. Thus the data in a memory cell is determined by the presence or absence of a charge on the floating gate.

Flash memories have a typical operating voltage in the range of about 1.8 to 5 volts. A high voltage, however, is usually required for programming and erase operations in a flash memory. This high voltage (Vpp) is in the range of the 10 to 13 volts, but can be higher. During a programming operation, electrons are injected onto the floating gate by applying the high voltage (Vpp) to the control gate and about one-half Vpp to the drain region while the source region is grounded. Electron tunneling from the floating gate during an erase operation is accomplished by applying Vpp to the source region, connecting the control gate to ground potential and leaving the drain region electrically unconnected or floating. Alternately, a large negative voltage could be applied to the gate and a higher voltage applied to the source to perform a negative gate erase operation.

The construction and operation of a basic stacked floating gate memory cell is described with reference to FIGS. 1A, 1B and 1C. FIG. 1A is a cross-sectional view of a typical floating gate memory cell used in flash memories. Memory cell 100 comprises a source region 102 and a drain region 104. Source 102 and drain 104 are constructed from N+ type regions formed in a P-type semiconductor substrate 106. Source 102 and drain 104 are separated by a channel region 108. Memory cell 100 further includes a floating gate 110 formed by a first polysilicon layer, and a control gate 114 formed by a second polysilicon layer. Floating gate 110 is isolated from control gate 114 by an interpoly dielectric layer 112 and from channel region 108 by a thin gate oxide, or tunnel layer 116. The source region 102 generally has a deeper junction than the drain region 104 for improving erase operations.

FIG. 1B is the memory cell 100 of FIG. 1A during a programming operation. To program the memory cell 100 to store a charge, a positive programming voltage of about 12 volts is applied to control gate 114. This positive programming voltage attracts electrons 120 from P-type substrate 106 and causes them to accumulate toward the surface of channel region 108. The drain 104 voltage is increased to about 6 volts, and source 102 is connected to ground. As the drain-to-source voltage increases, electrons 120 begin to flow from source 102 to drain 104 via channel region 108. Electrons 120 acquire substantially large kinetic energy and are referred to as hot electrons.

The voltage difference between control gate 114 and drain 104 creates an electric field through tunnel layer 116, this electric field attracts the hot electrons and accelerates them towards floating gate 110. Floating gate 110 starts to trap and accumulate the hot electrons, beginning the charging process. As the charge on the floating gate increases, the electric field through tunnel layer 116 decreases and eventually loses it capability of attracting any more of the hot electrons. At this point, floating gate 110 is fully charged. The charged floating gate 110 raises the memory cell 100's threshold voltage (Vt) above logic 1 (High) voltage. Thus, when control gate 114 is brought to a logic 1 (High) during a read operation, the memory cell 100 will barely turn on. As known to those skilled in the art, sense amplifiers are typically used in a memory to detect and amplify the state of the memory cell.

FIG. 1C is the memory cell 100 of FIG. 1B during an erase operation. The memory cell 100 is erased by discharging the floating gate. To erase the memory cell 100, a positive voltage of about 12 volts is applied to source 102 while control gate 114 is connected to ground and drain 104 is left unconnected, electrically floating. Alternately, a negative voltage, such as 10 volts, can be applied to the control gate while the source is coupled to 5 volts. With a higher relative voltage at source 102, negatively-charged hot electrons 120 are attracted and tunneled to source 102 through the tunnel layer 116. The tunneling is stopped when the floating gate is discharged. The lack of negative charge on floating gate 110 returns the memory cell 100's threshold voltage below logic 1 voltage. Thus, when a voltage on control gate 114 is brought to a logic 1 during a read operation, the memory cell 100 will turn on. While the construction and operation of memory cell 100 are typical of the general concept of floating gate memory cells, those skilled in the art will recognize that the foregoing description is not intended to cover all variations of floating gate memory cells known in the art.

As device sizes continually decrease, operating voltages must decrease. Reduced operating voltages generally require reduced gate resistance for acceptable operating characteristics. In addition, the realities of self-aligned contact (SAC) processing call for reduced gate height as devices are packed more tightly in the available die real estate.

Tungsten has been identified as one approach for reducing gate height and gate resistance for field-effect transistor (FET) gates in general. Tungsten, however, is incompatible with oxidation processes, causing peeling, stress and related problems with the tungsten layer. One solution to using tungsten in FET gates has been to selectively oxidize the gate sidewalls in an $H_2O/H_2$ ambient. This ambient will oxidize the polysilicon sidewalls, but not the tungsten portion, thus eliminating the oxidation problems associated with tungsten. However, exposure of floating gate memory cells to water and hydrogen is known to cause certain reliability, erase uniformity and yield problems, so it is desirable to avoid this process in the case of floating gate memory cells. Yet the sidewalls of the floating gate must generally be oxidized in order to limit charge loss on the floating gate to acceptable levels, often on the order of one to two electrons per day.

For the reasons stated above, and for other reasons stated below which will become apparent to those skilled in the art upon reading and understanding the present specification, there is a need in the art for improved flash memory gate stacks and methods of their fabrication.

SUMMARY

One embodiment of the invention includes a floating gate stack. The floating gate stack includes a first polysilicon layer, a dielectric layer over the first polysilicon layer, a second polysilicon layer over the dielectric layer, and a barrier layer over the second polysilicon layer. The floating gate stack further includes a metal layer over the barrier layer and a cap layer over the metal layer. An oxidation barrier is adjacent sidewalls of at least the metal layer and a sidewall oxide layer is adjacent sidewalls of at least the first polysilicon layer.

Another embodiment of the invention includes a floating gate stack. The floating gate stack includes a first polysilicon layer, a second polysilicon layer and a dielectric layer interposed between the first polysilicon layer and the second polysilicon layer. The floating gate stack further includes a metal layer, a barrier layer interposed between the metal layer and the second polysilicon layer, and a cap layer over the metal layer. An oxidation barrier is adjacent sidewalls of at least the metal layer, and a sidewall oxide layer is adjacent sidewalls of at least the first polysilicon layer.

A further embodiment of the invention includes a method of forming a floating gate stack. The method includes forming a polysilicon floating gate, forming a metal control gate and forming a dielectric layer interposed between the polysilicon floating gate and the metal control gate. The method further includes forming an oxidation barrier on sidewalls of the metal control gate, and oxidizing sidewalls of the polysilicon floating gate subsequent to forming the oxidation barrier on the sidewalls of the metal control gate.

A still further embodiment of the invention includes a method of forming a floating gate stack. The method includes forming a first polysilicon layer over a tunnel layer, forming a dielectric layer over the first polysilicon layer, patterning the first polysilicon layer and the dielectric layer using the tunnel layer as a stopping layer and forming a second polysilicon layer over the dielectric layer. The method further includes forming a barrier layer over the second polysilicon layer, forming a metal layer over the barrier layer, forming a cap layer over the metal layer, and patterning the second polysilicon layer, the barrier layer, the metal layer and the cap layer using the dielectric layer as a stopping layer to form a control gate. The method still further includes forming an oxidation barrier over the control gate, anisotropically removing a portion of the oxidation barrier to leave a remaining portion adjacent at least the metal layer, patterning a remaining portion of the first polysilicon layer and the dielectric layer using the cap layer and the remaining portion of the oxidation barrier as a mask, and oxidizing sidewalls of the first polysilicon layer subsequent to forming the oxidation barrier, thereby forming a sidewall oxide layer adjacent at least the first polysilicon layer.

Further embodiments include floating gate stacks and methods of forming floating gate stacks of various scope, as well as apparatus produced therefrom.

DESCRIPTION OF THE EMBODIMENTS

In the following detailed description of the preferred embodiments, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that process or mechanical changes may be made without departing from the scope of the present invention. The terms wafer and substrate used previously and in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the appended claims.

Figure 1A:
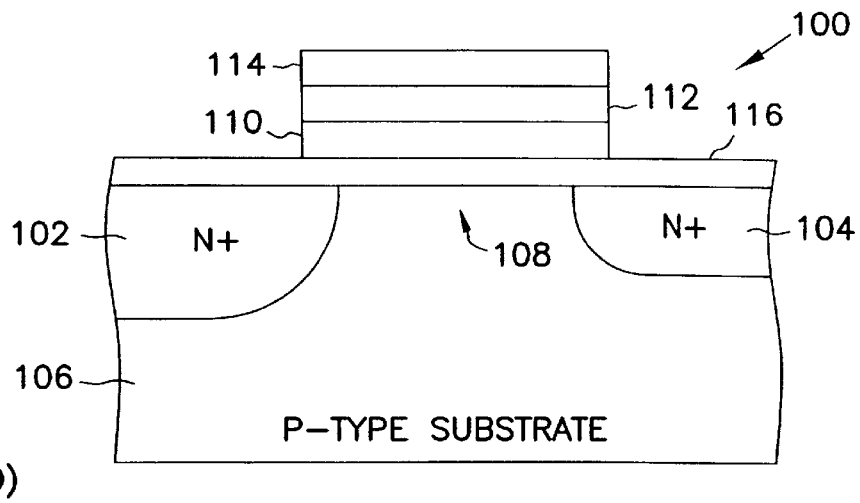
FIG. 1A is a cross-sectional view of a typical floating gate memory cell.
Figure 1B:
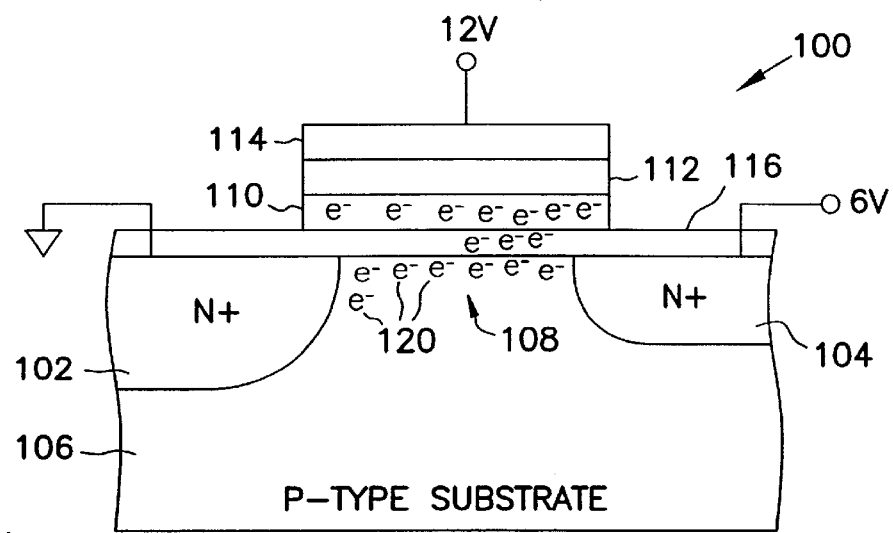
FIG. 1B is the floating gate memory cell of FIG. 1A during programming.
Figure 1C:
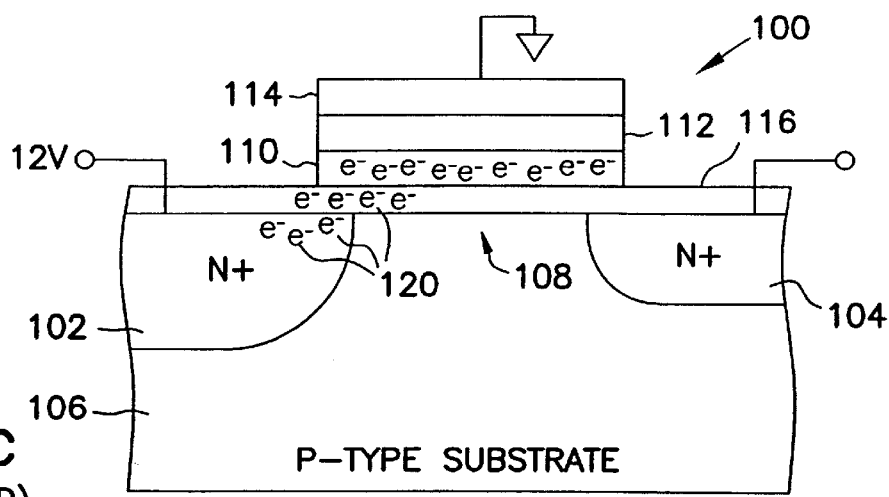
FIG. 1C is the floating gate memory cell of FIG. 1A during an erase operation.
Figure 2A:
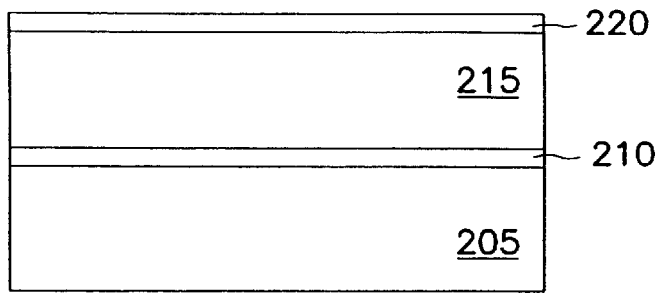
FIGS. 2A–2I are cross-sectional views of a floating gate stack throughout various processing stages in accordance with an embodiment of the invention.

FIGS. 2A–2I generally depict a method of forming a floating gate stack in accordance with one embodiment of the invention. In FIG. 2A, a tunnel layer 210 is formed on a substrate 205. Tunnel layer 210 is generally a silicon oxide, but may be any insulative material. Substrate 205 may be a P-type silicon substrate. A first polysilicon layer 215 is formed over the tunnel layer 210. First polysilicon layer 215 will become the floating gate in this embodiment. First polysilicon layer 215 may be conductively doped.

A dielectric layer 220 is formed over the first polysilicon layer 215. Dielectric layer 220 contains the dielectric ONO (oxide-nitride-oxide) in this embodiment. Other dielectric materials may be substituted for the ONO, such as tantalum oxide, barium strontium titanate, silicon nitride and other dielectric materials known to those skilled in the art. Dielectric layer 220 and the first polysilicon layer 215 are then patterned into strips (not shown) in a direction parallel to the face of the drawing.

Figure 2B:
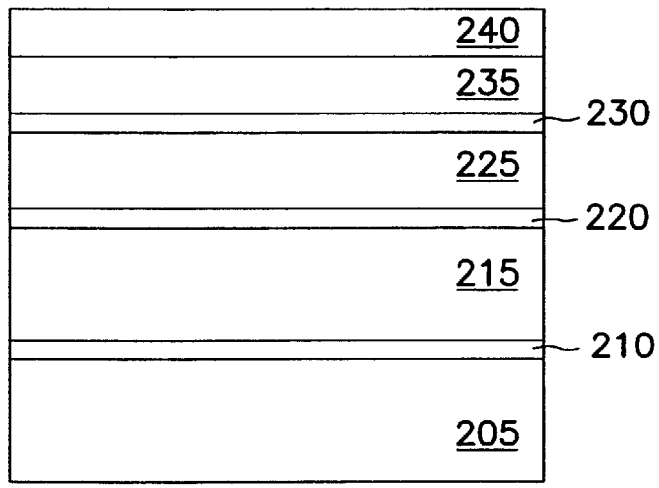

In FIG. 2B, subsequent to the patterning of the dielectric layer 220 and the first polysilicon layer 215, a second polysilicon layer 225 is formed over the dielectric layer 220. The second polysilicon layer 225 may also be conductively doped.

A conductive barrier layer 230 is formed over the second polysilicon layer 225 prior to formation of metal layer 235 over the barrier layer 230. Barrier layer 230 inhibits the growth of metal silicides between the second polysilicon layer 225 and metal layer 235. Barrier layer 230 is preferably a metal nitride, e.g., tungsten nitride or titanium nitride. Metal layer 235 is tungsten in this embodiment, but may be any metal, particularly the refractory metals of titanium, tungsten, tantalum, cobalt and molybdenum. A cap layer 240 is formed over the metal layer 235. Cap layer 240 is an insulator material, and contains silicon nitride in this embodiment.

Figure 2C:
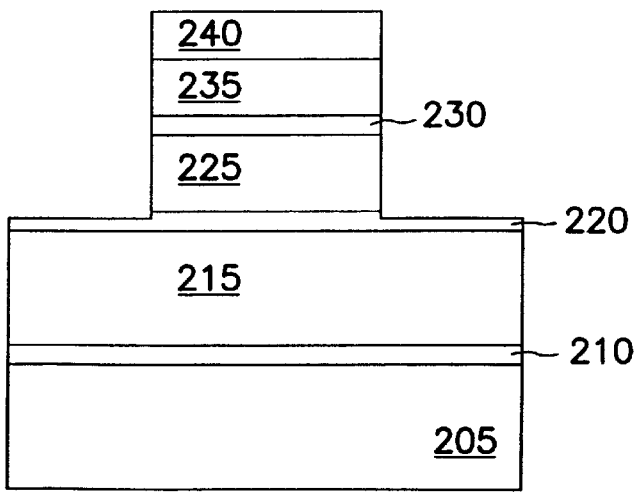

The resulting structure including the second polysilicon layer 225, the barrier layer 230, the metal layer 235 and the cap layer 240 is then patterned in FIG. 2C using the dielectric layer 220 as the stopping layer. The patterned metal layer 235, barrier layer 230 and second polysilicon layer 225 form a control gate. The control gate will be referred to as a metal control gate as it contains a metal layer in the stack. As is well understood in the art, this patterning can be performed using an etchant that is not selective to the material of the dielectric layer 220, which is thus incapable of, or less efficient at, removing dielectric layer 220. The patterning depicted in FIG. 2C preferably forms strips containing the second polysilicon layer 225 running generally perpendicular to, or otherwise divergent from, the strips containing the first polysilicon layer 215. A portion of the dielectric layer 220 may be removed, but the removal of material should not extend into the first polysilicon layer 215.

Figure 2D:
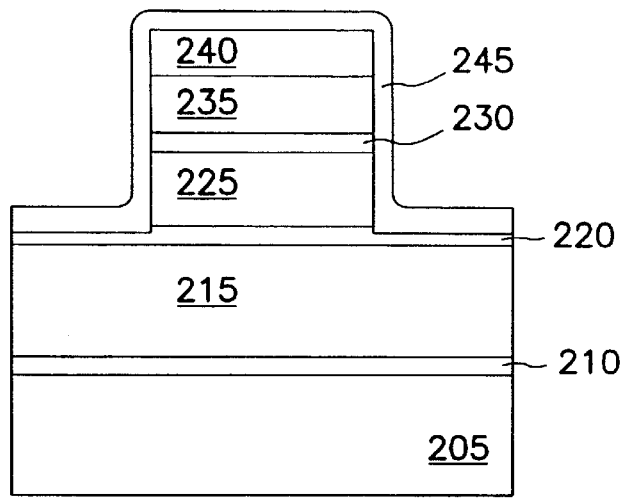

Subsequent to patterning the second polysilicon layer 225 and associated layers, an oxidation barrier 245 is formed over the structure in FIG. 2D, including the control gate. Oxidation barrier 245 contains material capable of inhibiting oxidation of the metal layer 235 during a subsequent oxidation of the floating gate. In this embodiment, oxidation barrier 245 is preferably another layer of nitride material, such as silicon nitride. Oxidation barrier 245 is adjacent the sidewalls of at least the metal layer 235, and preferably adjacent the second polysilicon layer 225, barrier layer 230 and metal layer 235, i.e., the control gate, and cap layer 240. Oxidation barrier 245 may further be adjacent a portion of the dielectric layer 220.

Figure 2E:
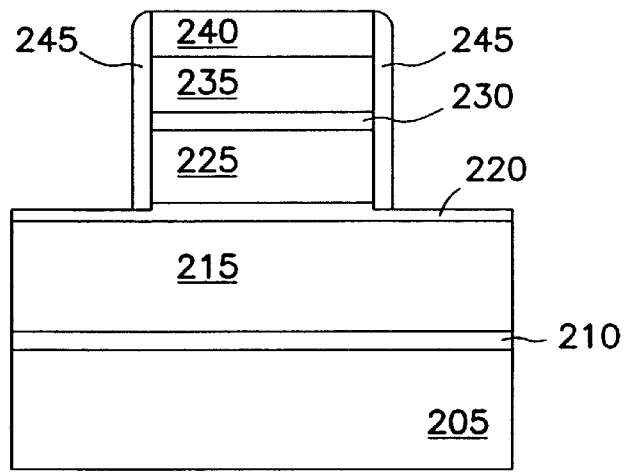
Figure 2F:
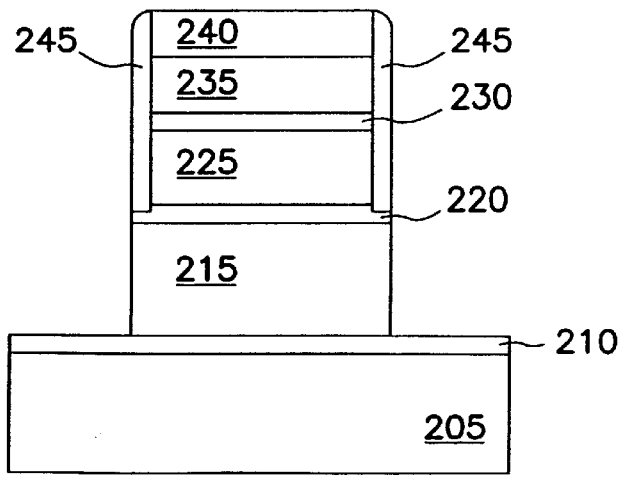
Figure 2G:
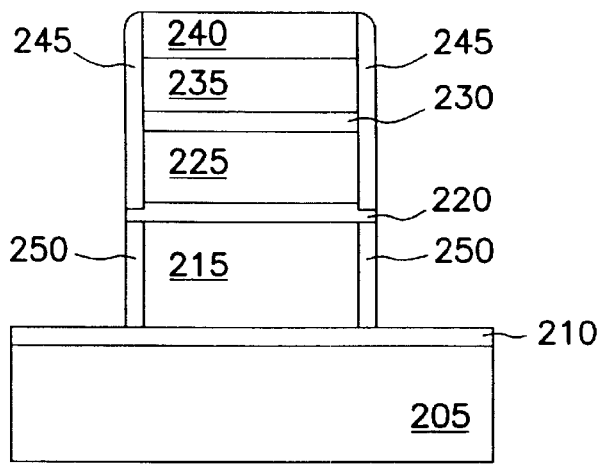

Oxidation barrier 245 is anisotropically removed in FIG. 2E, using the first polysilicon layer 215 as the stopping layer. Further portions of the first polysilicon layer 215 are then removed using cap layer 240 and oxidation barrier 245 as a mask, resulting in the structure of FIG. 2F. The exposed sidewalls of the first polysilicon layer 215 are oxidized, such as by thermal oxidation, in FIG. 2G to form sidewall oxide layer 250. Sidewall oxide layer 250 is adjacent the sidewalls of at least the first polysilicon layer 215.

Figure 2H:
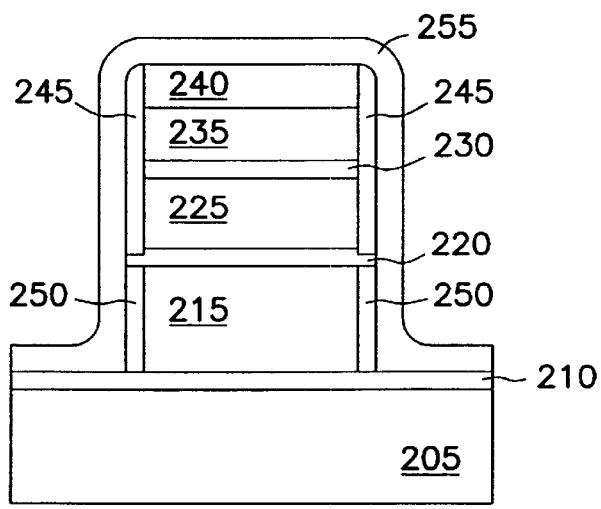
Figure 2I:
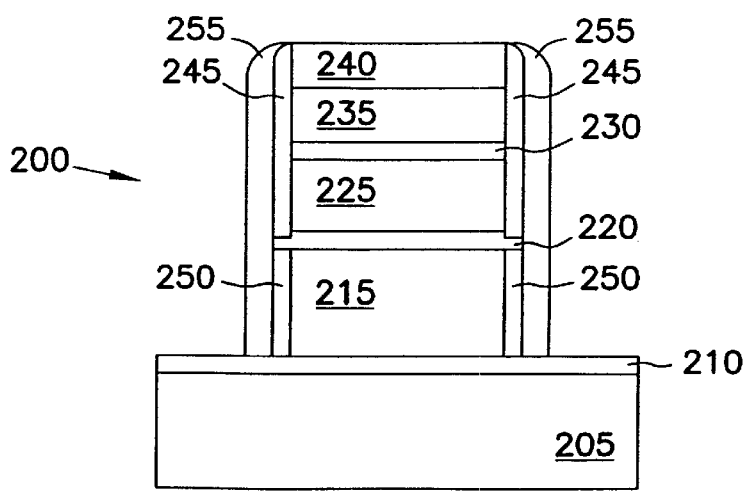

A spacer layer 255 is formed over the structure in FIG. 2H. Spacer layer 255 is an insulator material. Insulator materials suitable for use in this embodiment include silicon nitride, silicon oxide, silicon oxynitride and other insulator materials known in the art. Spacer layer 255 is then anisotropically removed in FIG. 2I, using the tunnel layer 210 as the stopping layer. Spacer layer 255 is adjacent the oxidation barrier 245 and the sidewall oxide layer 250. Spacer layer 255 may further be adjacent at least a portion of the dielectric layer 220. The resulting floating gate stack 200 is suitable for use in a floating gate memory cell for use in floating gate devices.

Flash Memory Devices

Figure 3:
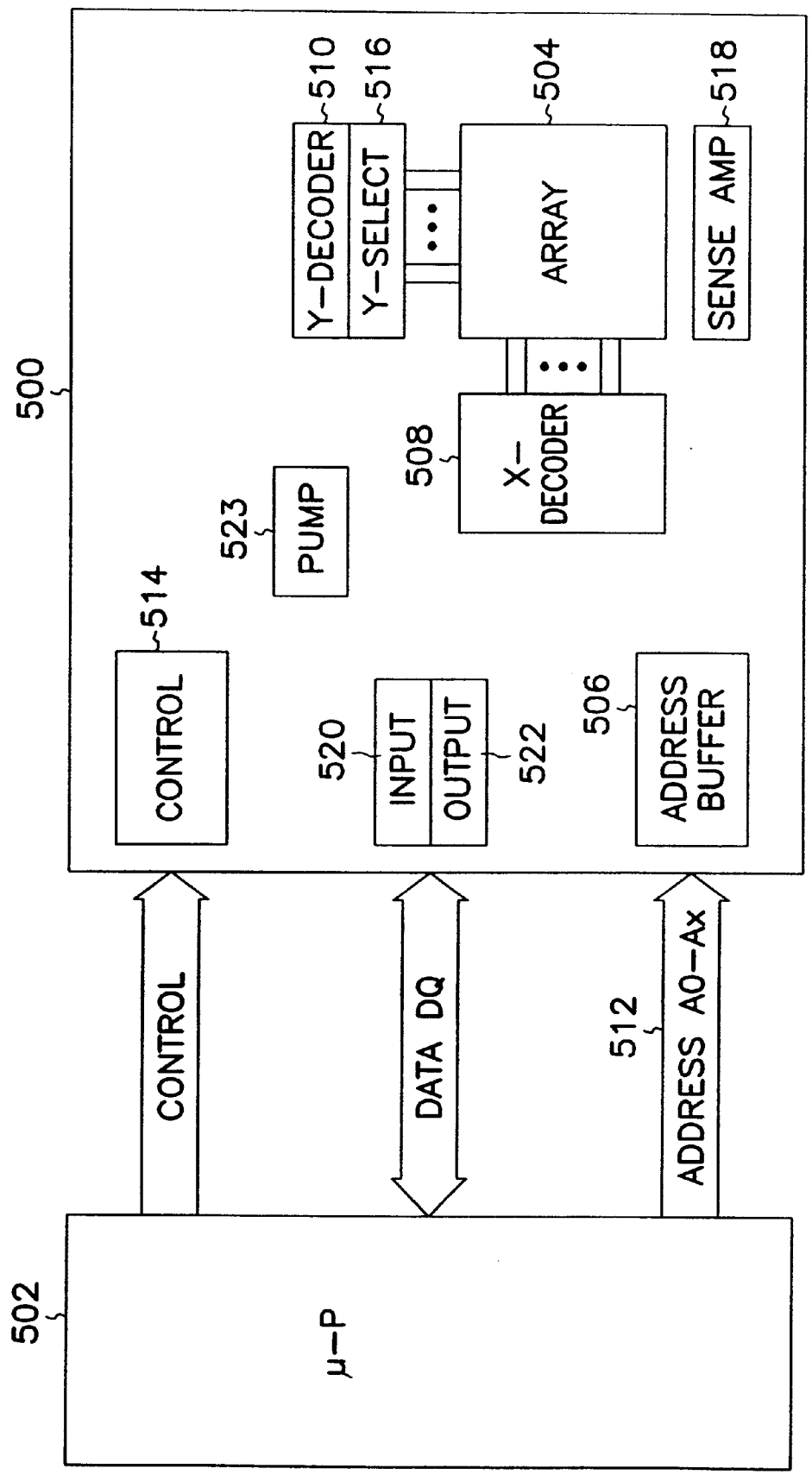
FIG. 3 is a block diagram of a floating gate device in accordance with an embodiment of the invention.

FIG. 3 is a block diagram of a flash memory device 500 which is coupled to a data controller 502. The memory device has been simplified to focus on features of the memory which are helpful in understanding the invention. The memory device 500 includes an array 504 of memory cells. The memory cells include at least one floating gate memory cell of the invention. The array is arranged in rows and columns, with the rows arranged in blocks. The blocks allow memory cells to be erased in large groups, or bytes, as is well known to those skilled in the art. Data, however, can be stored in the memory array in small data groups (byte or group of bytes) and separate from the block structure. Erase operations are typically performed on a large number of cells in parallel.

An x-decoder, or row decoder, 508 and a y-decoder, or column decoder, 510 are provided to decode address signals provided on address lines 512. Address signals are received and decoded to access the memory array 504. An address buffer circuit 506 is provided to latch the address signals. A y-select circuit 516 is provided to select a column of the array identified with the y-decoder 510. Sense amplifier and compare circuitry 518 is used to sense data stored in the memory cells and verify the accuracy of stored data. Data input 520 and output 522 buffer circuits are included for bi-directional data communication over a plurality of data (DQ) lines with the controller 502. Command control circuit 514 decodes signals provided on control lines from the controller 502. These signals are used to control the operations of the memory, including data read, data write, and erase operations. The flash memory device 500 can include a charge pump circuit 523 which generates a Vpp voltage used during programming of the memory cells and other internal operations.

As stated above, the flash memory device of FIG. 3 has been simplified to facilitate a basic understanding of the features of the memory. It will be appreciated that more than one flash memory device can be included in various package configurations. For example, flash memory modules can be manufactured in varying densities using one or more flash memory devices.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dies as is well known in the art.

Semiconductor Dies

Figure 4:
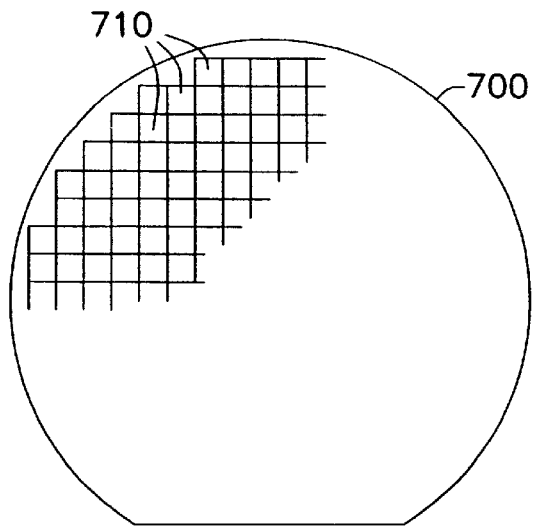
FIG. 4 is an elevation view of a wafer containing semiconductor dies in accordance with an embodiment of the invention.

With reference to FIG. 4, in one embodiment, a semiconductor die 710 is produced from a wafer 700. A die is an individual pattern, typically rectangular, on a substrate that contains circuitry, or integrated circuit devices, to perform a specific function. Semiconductor die 710 has at least one floating gate stack in accordance with the invention. A semiconductor wafer will typically contain a repeated pattern of such dies containing the same functionality. Die 710 may contain circuitry for the inventive flash memory device, as discussed above. Die 710 may further contain additional circuitry to extend to such complex devices as a monolithic processor with multiple functionality. Die 710 is typically packaged in a protective casing (not shown) with leads extending therefrom (not shown) providing access to the circuitry of the die for unilateral or bilateral communication and control.

Circuit Modules

Figure 5:
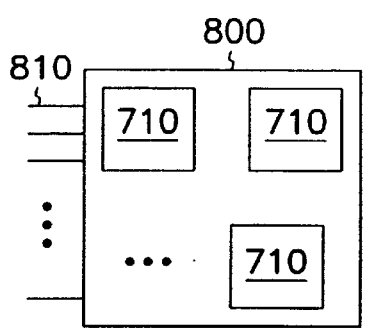
FIG. 5 is a block diagram of an exemplary circuit module in accordance with an embodiment of the invention.

As shown in FIG. 5, two or more dies 710 may be combined, with or without protective casing, into a circuit module 800 to enhance or extend the functionality of an individual die 710. Circuit module 800 may be a combination of dies 710 representing a variety of functions, or a combination of dies 710 containing the same functionality. One or more dies 710 of circuit module 800 contain at least one floating gate stack in accordance with the invention.

Some examples of a circuit module include memory modules, device drivers, power modules, communication modems, processor modules and application-specific modules and may include multilayer, multichip modules. Circuit module 800 may be a subcomponent of a variety of electronic systems, such as a clock, a television, a cell phone, a personal computer, an automobile, an industrial control system, an aircraft and others. Circuit module 800 will have a variety of leads 810 extending therefrom and coupled to the dies 710 providing unilateral or bilateral communication and control.

Figure 6:
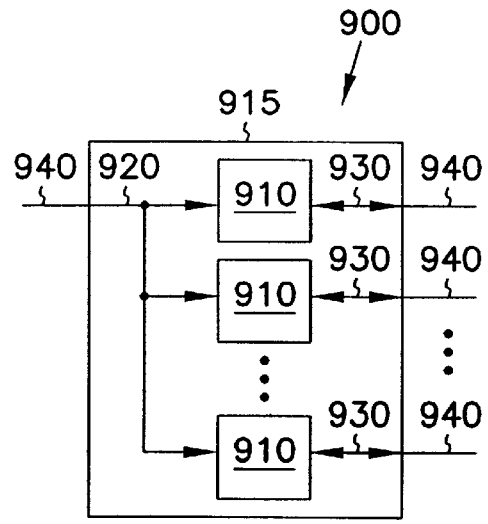
FIG. 6 is a block diagram of an exemplary flash memory module in accordance with an embodiment of the invention.

FIG. 6 shows one embodiment of a circuit module as flash memory module 900. Flash memory module 900 contains multiple flash memory devices 910 contained on support 915. Flash memory module 900 accepts a command signal from an external controller (not shown) on a command link 920 and provides for data input and data output on data links 930. The command link 920 and data links 930 are connected to leads 940 extending from the support 915. Leads 940 are shown for conceptual purposes and are not limited to the positions shown in FIG. 6.

Electronic Systems

Figure 7:
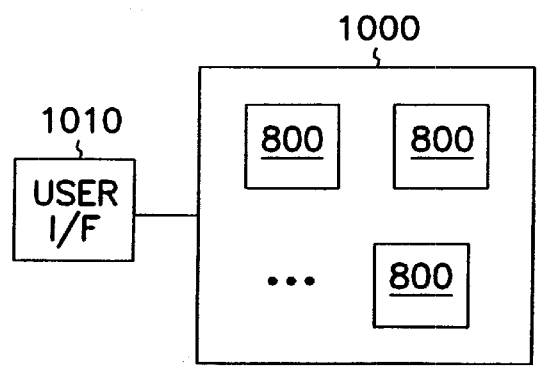
FIG. 7 is a block diagram of an exemplary electronic system in accordance with an embodiment of the invention.

FIG. 7 shows an electronic system 1000 containing one or more circuit modules 800. Electronic system 1000 generally contains a user interface 1010. User interface 1010 provides a user of the electronic system 1000 with some form of control or observation of the results of the electronic system 1000. Some examples of user interface 1010 include the keyboard, pointing device, monitor or printer of a personal computer; the tuning dial, display or speakers of a radio; the ignition switch, gauges or gas pedal of an automobile; and the card reader, keypad, display or currency dispenser of an automated teller machine. User interface 1010 may further describe access ports provided to electronic system 1000. Access ports are used to connect an electronic system to the more tangible user interface components previously exemplified. One or more of the circuit modules 800 may be a processor providing some form of manipulation, control or direction of inputs from or outputs to user interface 1010, or of other information either preprogrammed into, or otherwise provided to, electronic system 1000. As will be apparent from the lists of examples previously given, electronic system 1000 will often contain certain mechanical components (not shown) in addition to circuit modules 800 and user interface 1010. It will be appreciated that the one or more circuit modules 800 in electronic system 1000 can be replaced by a single integrated circuit. Furthermore, electronic system 1000 may be a subcomponent of a larger electronic system.

Figure 8:
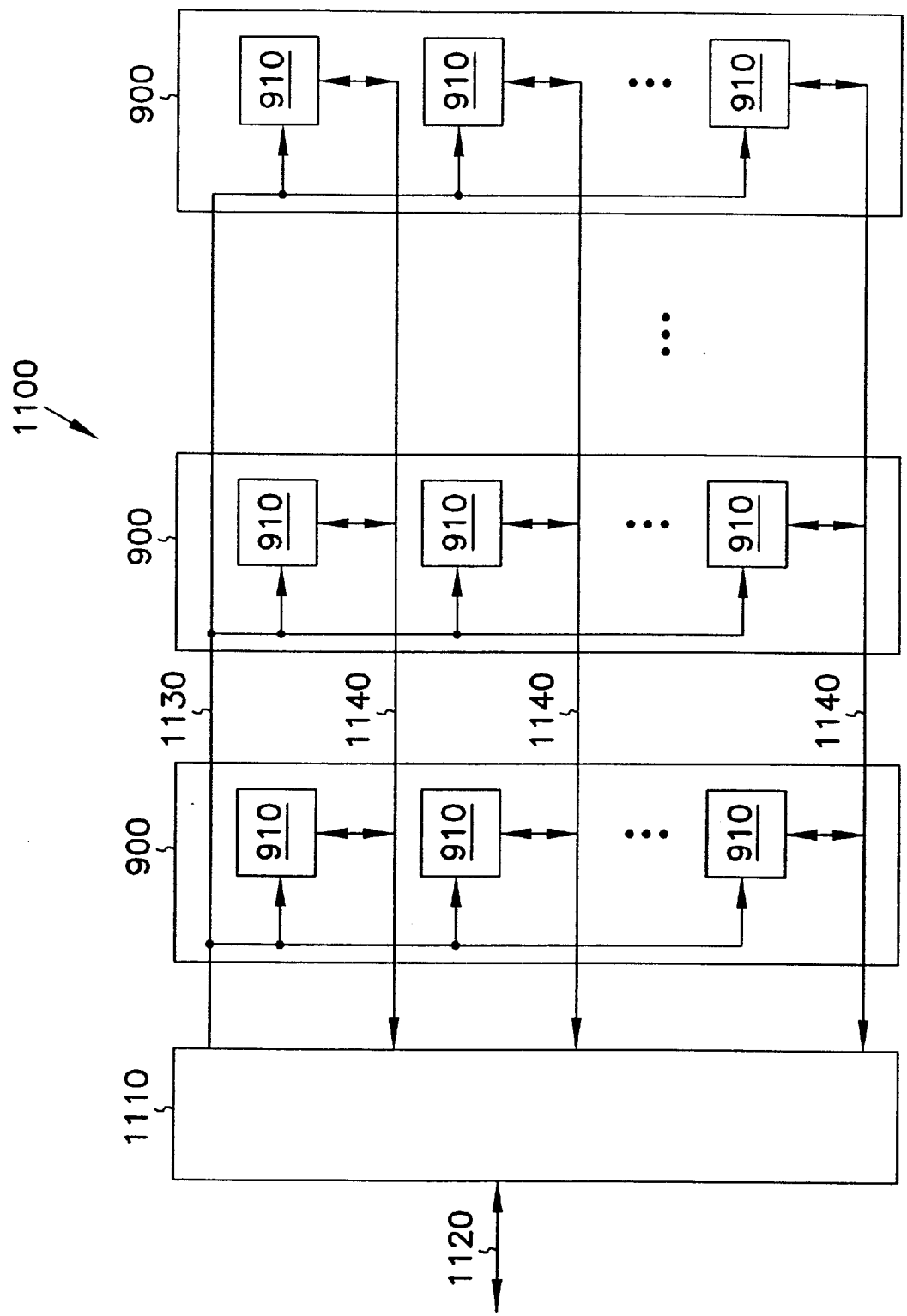
FIG. 8 is a block diagram of an exemplary memory system in accordance with an embodiment of the invention.

FIG. 8 shows one embodiment of an electronic system as memory system 1100. Memory system 1100 contains one or more flash memory modules 900 and a memory controller 1110. Memory controller 1110 provides and controls a bidirectional interface between memory system 1100 and an external system bus 1120. Memory system 1100 accepts a command signal from the external bus 1120 and relays it to the one or more flash memory modules 900 on a command link 1130. Memory system 1100 provides for data input and data output between the one or more memory modules 900 and external system bus 1120 on data links 1140.

Figure 9:
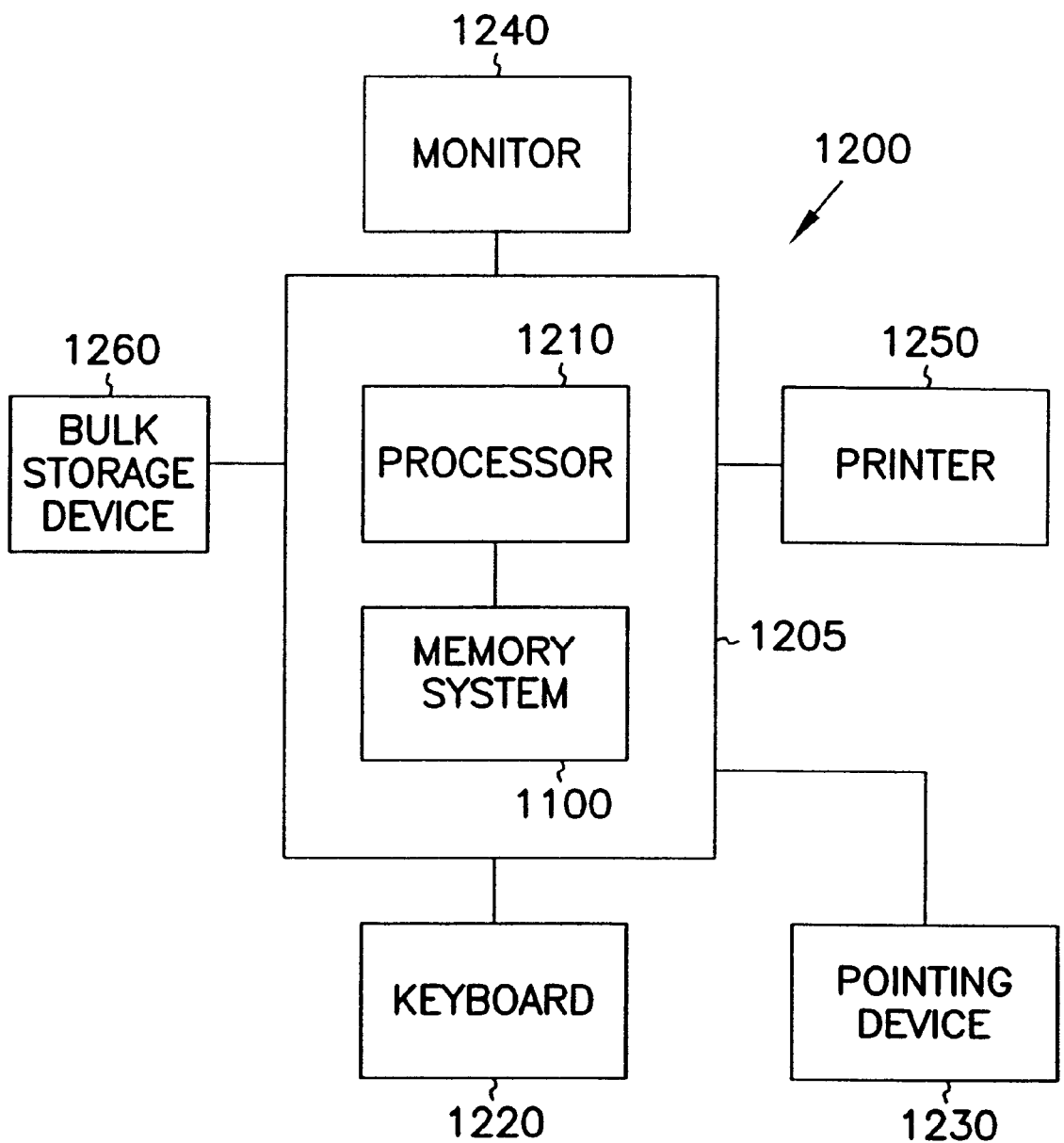
FIG. 9 is a block diagram of an exemplary computer system in accordance with an embodiment of the invention.

FIG. 9 shows a further embodiment of an electronic system as a computer system 1200. Computer system 1200 contains a processor 1210 and a memory system 1100 housed in a computer unit 1205. Computer system 1200 is but one example of an electronic system containing another electronic system, i.e., memory system 1100, as a subcomponent. Computer system 1200 optionally contains user interface components. Depicted in FIG. 9 are a keyboard 1220, a pointing device 1230, a monitor 1240, a printer 1250 and a bulk storage device 1260. Bulk storage device 1260 may be a memory system having flash memory devices in accordance with the invention.

It will be appreciated that other components are often associated with computer system 1200 such as modems, device driver cards, additional storage devices, etc. It will further be appreciated that the processor 1210 and memory system 1100 and/or bulk storage device 1260 of computer system 1200 can be incorporated on a single integrated circuit. Such single package processing units reduce the communication time between the processor and the memory circuit.

Conclusion

Floating gate stacks having a metal control gate and a polysilicon floating gate and their methods of fabrication have been described that are particularly useful for floating gate memory cells and apparatus produced therefrom. The metal control gate permits reduced gate resistance and gate height over polysilicon or silicide control gates. An oxidation barrier is formed on sidewalls of the metal control gate to protect it from oxidation during oxidation of sidewalls of the polysilicon floating gate. The oxidation barrier is useful in reducing peeling, stress and related oxidation problems when using metals such as tungsten in the metal control gate.

Although specific embodiments have been illustrated and described herein, it will be appreciated by those of ordinary skill in the art that any arrangement which is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of forming a floating gate stack, comprising:
   forming a polysilicon floating gate;
   forming a metal control gate;
   forming a dielectric layer interposed between the polysilicon floating gate and the metal control gate;
   forming an oxidation barrier on sidewalls of the metal control gate; and
   oxidizing sidewalls of the polysilicon floating gate subsequent to forming the oxidation barrier.

2. The method of claim 1, wherein the polysilicon is conductively doped.

3. The method of claim 1, wherein the dielectric layer comprises a dielectric material selected from the group consisting of ONO, tantalum oxide, barium strontium titanate and silicon nitride.

4. The method of claim 1, wherein the metal control gate comprises a metal layer comprising a refractory metal selected from the group consisting of titanium, tungsten, tantalum, cobalt and molybdenum.

5. The method of claim 1, wherein the metal control gate comprises a tungsten layer.

6. The method of claim 1, wherein the oxidation barrier comprises silicon nitride.

7. The method of claim 1, further comprising forming a spacer layer comprising an insulator material selected from the group consisting of silicon oxides, silicon nitrides and silicon oxynitrides, and adjacent the oxidation barrier and the sidewall oxide layer.

8. The method of claim 1, wherein the method is performed in the order presented.

9. A method of forming a floating gate stack, comprising:
forming a polysilicon floating gate;
forming a metal control gate comprising a layer of refractory metal selected from the group consisting of titanium, tungsten, tantalum, cobalt and molybdenum;
forming a dielectric layer comprising a dielectric material selected from the group consisting of ONO, tantalum oxide, barium strontium titanate and silicon nitride, and interposed between the polysilicon floating gate and the metal control gate;
forming an oxidation barrier on sidewalls of the metal control gate; and
oxidizing sidewalls of the polysilicon floating gate subsequent to forming the oxidation barrier.

10. The method of claim 9, further comprising forming a spacer layer comprising an insulator material selected from the group consisting of silicon oxides, silicon nitrides and silicon oxynitrides, and adjacent the oxidation barrier and the sidewall oxide layer.

11. The method of claim 9, wherein the method is performed in the order presented.

12. A method of forming a floating gate stack, comprising:
forming a polysilicon floating gate;
forming a metal control gate comprising a tungsten layer;
forming a dielectric layer comprising a dielectric material selected from the group consisting of ONO, tantalum oxide, barium strontium titanate and silicon nitride, and interposed between the polysilicon floating gate and the metal control gate;
forming an oxidation barrier on sidewalls of the metal control gate; and
oxidizing sidewalls of the polysilicon floating gate subsequent to forming the oxidation barrier.

13. The method of claim 12, wherein the method is performed in the order presented.

14. A method of forming a floating gate stack, comprising:
forming a first polysilicon layer over a tunnel layer;
forming a dielectric layer over the first polysilicon layer;
patterning the first polysilicon layer and the dielectric layer using the tunnel layer as a stopping layer;
forming a second polysilicon layer over the dielectric layer;
forming a barrier layer over the second polysilicon layer;
forming a metal layer over the barrier layer;
forming a cap layer over the metal layer;
patterning the second polysilicon layer, the barrier layer, the metal layer and the cap layer using the dielectric layer as a stopping layer to form a control gate;
forming an oxidation barrier over the control gate;
anisotropically removing a portion of the oxidation barrier to leave a remaining portion adjacent at least the metal layer;
patterning a remaining portion of the first polysilicon layer and the dielectric layer using the cap layer and the remaining portion of the oxidation barrier as a mask; and
oxidizing sidewalls of the first polysilicon layer subsequent to forming the oxidation barrier, thereby forming a sidewall oxide layer adjacent at least the first polysilicon layer.

15. The method of claim 14, wherein at least one of the first polysilicon layer and the second polysilicon layer are conductively doped.

16. The method of claim 14, wherein the dielectric layer comprises a dielectric material selected from the group consisting of ONO, tantalum oxide, barium strontium titanate and silicon nitride.

17. The method of claim 14, wherein the barrier layer comprises a metal nitride selected from the group consisting of tungsten nitride and titanium nitride.

18. The method of claim 14, wherein the metal layer comprises a refractory metal selected from the group consisting of titanium, tungsten, tantalum, cobalt and molybdenum.

19. The method of claim 14, wherein the metal layer comprises tungsten.

20. The method of claim 14, wherein the cap layer comprises silicon nitride.

21. The method of claim 14, wherein the oxidation barrier comprises silicon nitride.

22. The method of claim 14, further comprising forming a spacer layer comprising an insulator material selected from the group consisting of silicon oxides, silicon nitrides and silicon oxynitrides, and adjacent the oxidation barrier and the sidewall oxide layer.

23. The method of claim 14, wherein the method is performed in the order presented.

24. A method of forming a floating gate stack, comprising:
forming a first polysilicon layer over a tunnel layer;
forming a dielectric layer comprising a dielectric material selected from the group consisting of ONO, tantalum oxide, barium strontium titanate and silicon nitride over the first polysilicon layer;
patterning the first polysilicon layer and the dielectric layer using the tunnel layer as a stopping layer;
forming a second polysilicon layer over the dielectric layer;
forming a barrier layer comprising a metal nitride selected from the group consisting of tungsten nitride and titanium nitride over the second polysilicon layer;
forming a metal layer comprising a refractory metal selected from the group consisting of titanium, tungsten, tantalum, cobalt and molybdenum over the barrier layer;
forming a first nitride layer over the metal layer;
patterning the second polysilicon layer, the barrier layer, the metal layer and the first nitride layer using the dielectric layer as a stopping layer to form a control gate;
forming a second nitride layer over the control gate;
anisotropically removing a portion of the second nitride layer to leave a remaining portion adjacent at least the metal layer;
patterning a remaining portion of the first polysilicon layer and the dielectric layer using the first nitride layer and the remaining portion of the second nitride layer as a mask; and oxidizing sidewalls of the first polysilicon layer subsequent to forming the oxidation barrier, thereby forming a sidewall oxide layer adjacent at least the first polysilicon layer.

25. The method of claim 24, further comprising forming a spacer layer comprising an insulator material selected from the group consisting of silicon oxides, silicon nitrides and silicon oxynitrides, and adjacent the oxidation barrier and the sidewall oxide layer.

26. The method of claim 24, wherein the method is performed in the order presented.

* * * * *